United States Patent
Upadhyayula et al.

(10) Patent No.: US 8,637,963 B2
(45) Date of Patent: Jan. 28, 2014

(54) RADIATION-SHIELDED SEMICONDUCTOR DEVICE

(75) Inventors: Suresh Kumar Upadhyayula, San Jose, CA (US); Hem Takiar, Fremont, CA (US); Chih-Chin Liao, Changhua (TW)

(73) Assignee: SanDisk Technologies Inc., Plano, TX (US)

( * ) Notice: Subject to any disclaimer, the term of this patent is extended or adjusted under 35 U.S.C. 154(b) by 46 days.

(21) Appl. No.: 13/253,344

(22) Filed: Oct. 5, 2011

(65) Prior Publication Data

US 2013/0087895 A1 Apr. 11, 2013

(51) Int. Cl.
*H01L 23/552* (2006.01)
*H01L 21/70* (2006.01)
*H01L 23/495* (2006.01)

(52) U.S. Cl.
USPC ............ 257/659; 257/508; 257/660; 257/676

(58) Field of Classification Search
USPC ................... 257/659, 508, 660, 676; 438/106
See application file for complete search history.

(56) References Cited

U.S. PATENT DOCUMENTS

| | | | |
|---|---|---|---|
| 5,789,064 A | 8/1998 | Valente et al. | |
| 6,707,168 B1 | 3/2004 | Hoffman et al. | |
| 7,288,728 B2 | 10/2007 | Koike | |
| 7,629,674 B1 | 12/2009 | Foster | |
| 7,799,602 B2 | 9/2010 | Pagaila | |
| 7,808,087 B2 | 10/2010 | Zhao | |
| 8,017,255 B2 | 9/2011 | Kawaguchi | |
| 2004/0150070 A1* | 8/2004 | Okada et al. | 257/508 |
| 2005/0206015 A1 | 9/2005 | Salzman | |
| 2007/0200210 A1* | 8/2007 | Zhao et al. | 257/676 |
| 2008/0067656 A1 | 3/2008 | Leung | |
| 2008/0308912 A1* | 12/2008 | Cha et al. | 257/659 |
| 2009/0302439 A1* | 12/2009 | Pagaila et al. | 257/660 |
| 2010/0078777 A1* | 4/2010 | Barth et al. | 257/659 |
| 2011/0037169 A1* | 2/2011 | Pagaila | 257/737 |
| 2011/0115060 A1* | 5/2011 | Chiu et al. | 257/660 |
| 2011/0140283 A1 | 6/2011 | Chandra | |
| 2011/0298106 A1 | 12/2011 | Kim | |

* cited by examiner

*Primary Examiner* — Long K Tran
*Assistant Examiner* — Dzung Tran
(74) *Attorney, Agent, or Firm* — Vierra Magen Marcus LLP

(57) ABSTRACT

A semiconductor device is disclosed including an electromagnetic radiation shield. The device may include a substrate having a shield ring defined in a conductance pattern on a surface of the substrate. One or more semiconductor die may be affixed and electrically coupled to the substrate. The one or more semiconductor die may then be encapsulated in molding compound. Thereafter, a metal may be plated around the molding compound and onto the shield ring to form an EMI/RFI shield for the device.

12 Claims, 8 Drawing Sheets

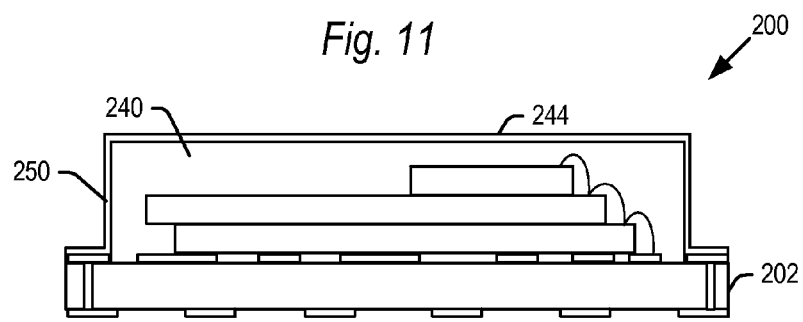
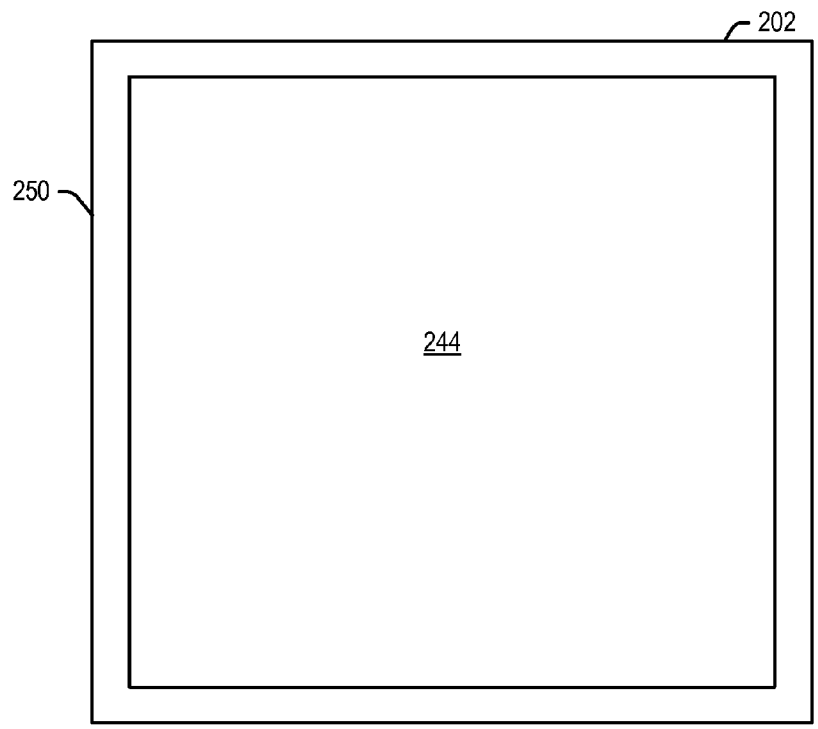

RADIATION-SHIELDED SEMICONDUCTOR DEVICE

BACKGROUND OF THE INVENTION

1. Field of the Invention

Embodiments of the present invention relate to semiconductor devices.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die 22, 24 mounted to a substrate 26. Although not shown in FIGS. 1 and 2, the semiconductor die are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds are soldered between the die bond pads of the semiconductor die 22, 24 and the contact pads of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

It is known to layer semiconductor die on top of each other either with an offset (prior art FIG. 1) or in a stacked configuration (prior art FIG. 2). In the offset configuration of FIG. 1, the die are stacked with an offset so that the bond pads of the next lower die are left exposed. The offset requires a greater footprint on the substrate, where space is at a premium. In the stacked configuration of FIG. 2, two or more semiconductor die are stacked directly on top of each other, thereby taking up less footprint on the substrate as compared to an offset configuration. However, in a stacked configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide a dielectric spacer layer 34 to provide enough room for the bond wires 30 to be bonded to the die bond pad on the lower die 24.

As electronic components get smaller and operate at higher frequencies, the noise and cross talk caused by electromagnetic interference (EMI) and radiofrequency interference (RFI) is becoming more of a concern. EMI is the induction of electromagnetic radiation, which is emitted by electrical circuits carrying rapidly changing signals, as a by-product of their normal operation to other circuits which causes unwanted signals (interference or noise). RFI is transmission of radiofrequency electromagnetic radiation from one circuit to another, also causing unwanted interference or noise.

Some semiconductor packages have attempted to shield the transmission and receipt of EMI and RFI radiation at the semiconductor package level. While preventing interference, these conventional solutions have other disadvantages which make inclusion of such features at the package level undesirable. Thus, shielding is typically performed at the host device level in which a semiconductor package is used. Host device level solutions typically involve providing a metal shield around the space where a semiconductor package is received or mounted.

BRIEF DESCRIPTION OF THE DRAWINGS

FIG. 11 is an edge view of a semiconductor device according to the present disclosure following a plating process.

FIG. 12 is a top view of a semiconductor device according to the present disclosure following a plating process.

DETAILED DESCRIPTION

Embodiments will now be described with reference to FIGS. 3 through 15, which relate to a semiconductor package including EMI and RFI shielding. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom" and "upper" and "lower" as may be used herein are for convenience and illustrative purposes only, and are not meant to limit the description of the invention inasmuch as the referenced item can be exchanged in position.

Figure 3:
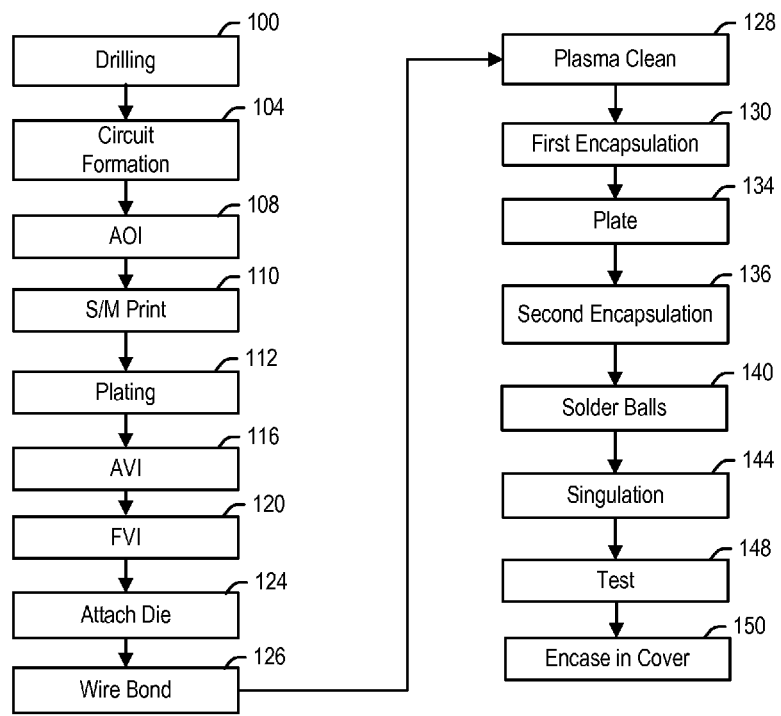
FIG. 3 is a flowchart showing the assembly of a semiconductor device according to the present disclosure.
Figure 4:
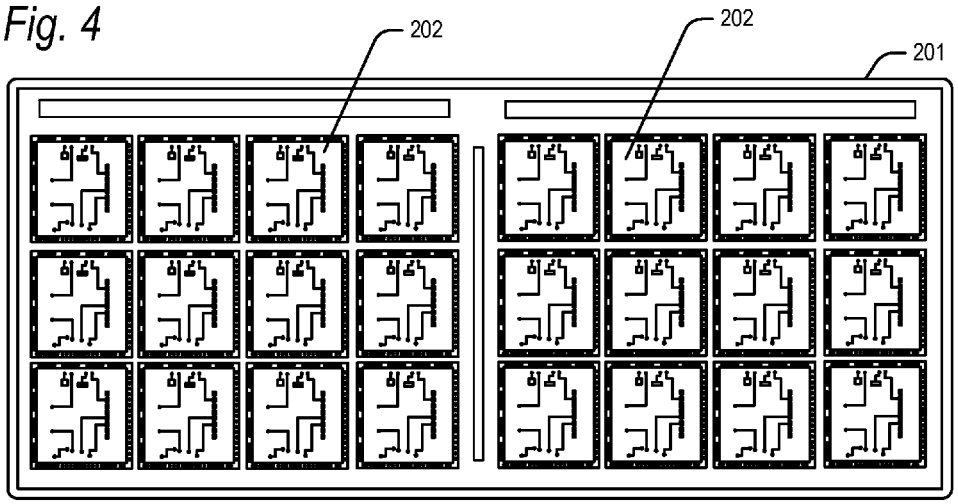
FIG. 4 is a top view of a substrate according to an embodiment of the present disclosure.

An embodiment of the present technology will now be explained with reference to the flowchart of FIG. 3, and the top and edge views of FIGS. 4 through 15. FIG. 4 is a top view of a substrate panel 201 including a plurality of substrates 202. Panel 201 allows batch processing of substrates 202 into a number of semiconductor devices 200 at the same time to achieve economies of scale. The number of rows and columns of substrates 202 on the substrate panel 201 is shown by way of example only and the number of rows and/or columns of substrates 202 may vary in further embodiments.

Figure 5:
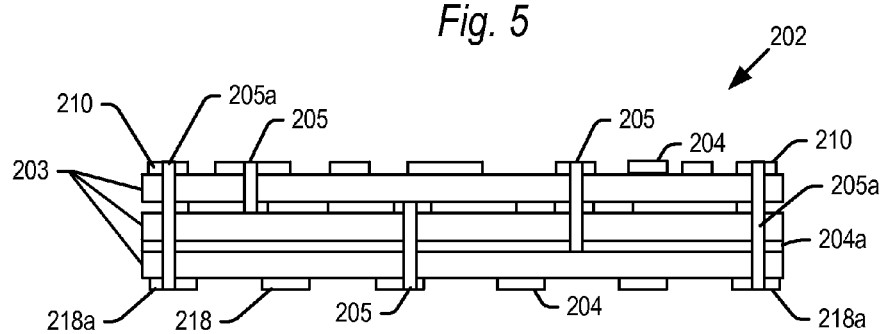
FIG. 5 is an edge view of a substrate according to an embodiment of the present disclosure.
Figure 6:
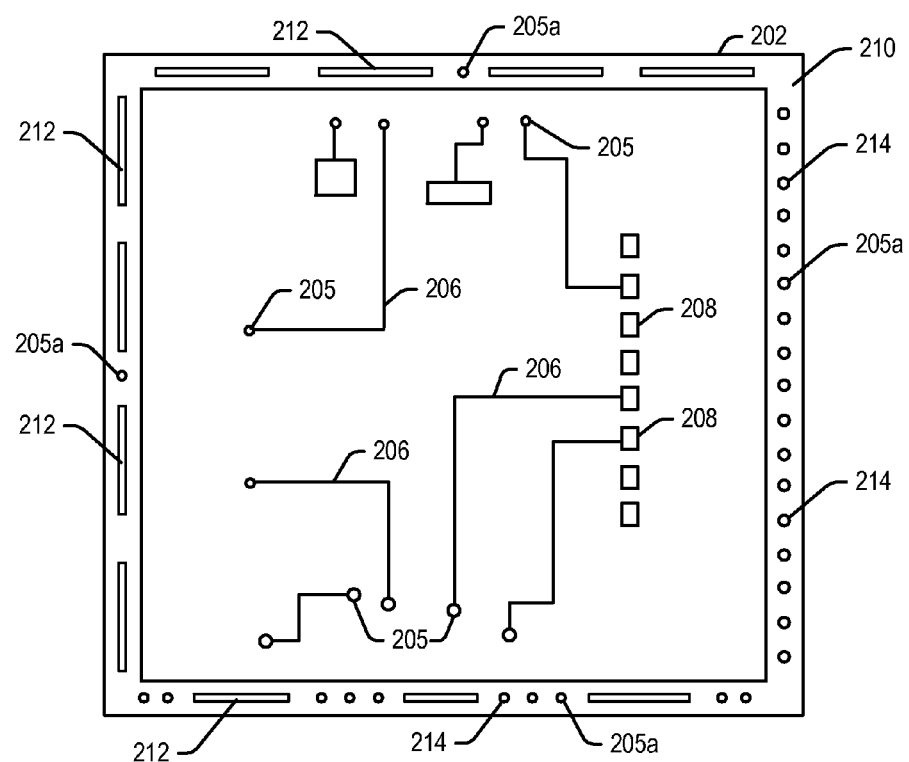
FIG. 6 is a top view of a substrate according to an embodiment of the present disclosure.
Figure 7:
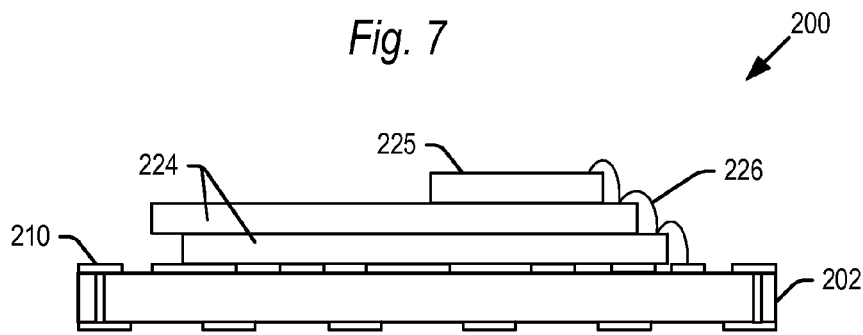
FIG. 7 is an edge view of a substrate and semiconductor die according to an embodiment of the present disclosure.
Figure 8:
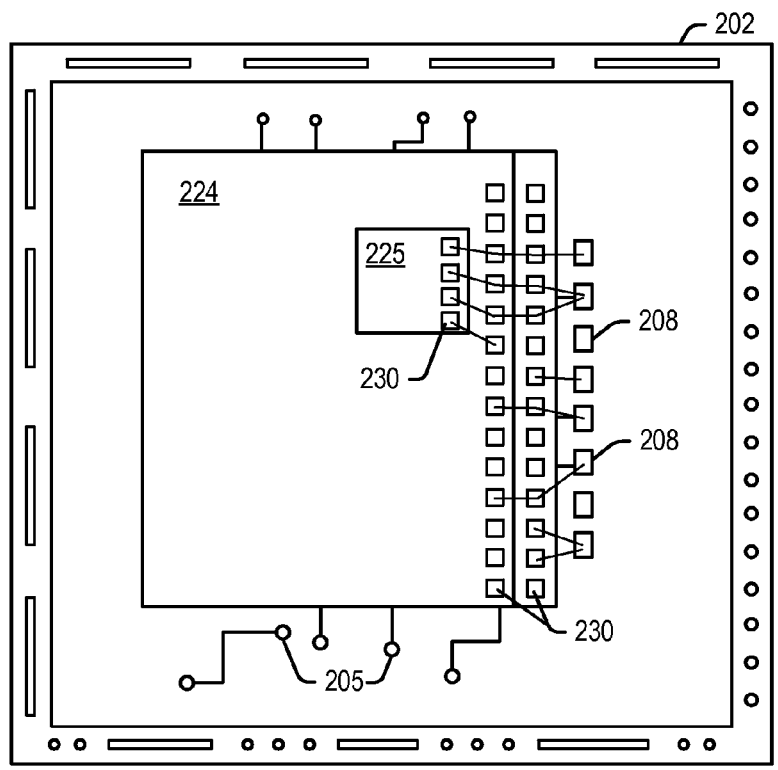
FIG. 8 is a top view of a substrate and semiconductor die according to an embodiment of the present disclosure.
Figure 9:
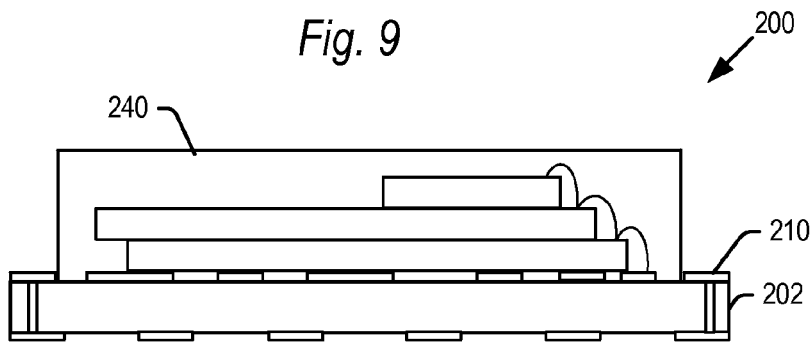
FIG. 9 is an edge view of a substrate and semiconductor die encapsulated during a first encapsulation process.
Figure 10:
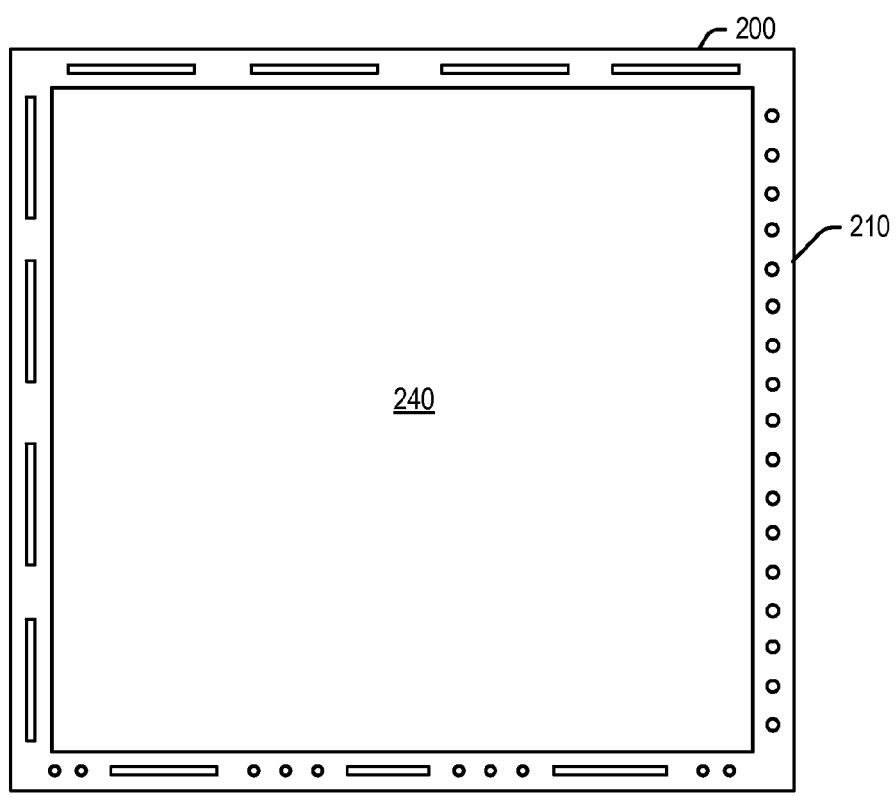
FIG. 10 is a top view of a substrate and semiconductor die encapsulated during a first encapsulation process.

An example of an individual substrate 202 is shown in edge and top views in FIGS. 5 and 6. The substrate 202 may be a variety of different chip carrier mediums, including a printed circuit board (PCB), a leadframe or a tape automated bonded (TAB) tape. Where substrate 202 is a PCB, the substrate may be formed of various conductive layers 204, each separated by a dielectric core 203. The edge views of FIGS. 7, 9, 11, 13 and 15 show a single core 203 surrounded by a pair of conductive layers for simplicity, but the substrate 202 in those figures may be the same as substrate 202 in FIG. 5.

The core 203 may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core may be ceramic or organic in alternative embodiments.

The conductive layers 204 surrounding the core may be formed of copper or copper alloys, plated copper or plated copper alloys, copper plated steel, or other metals and materials known for use on substrate panels. The conductive layers may have a thickness of about 10 μm to 25 μm, although the thickness of the conductive layers may vary outside of that range in alternative embodiments. As explained below, one of the conductive layers, for example layer 204a, may be used as a ground plane.

In a step 100, the substrate 202 is drilled to define through-hole vias 205 in the substrate 202. The vias 205 (some of which are numbered in the figures) are provided to communicate signals between different layers of the substrate 202. The number and position of vias 205 shown are by way of example, and the substrate may include many more vias 205 than is shown in the figures, and they may be in different locations than are shown in the figures. As explained below, vias 205 include one or more vias 205 for coupling a shield ring 210 on a top surface of the substrate to a ground pad on a bottom surface of the substrate.

Conductance patterns are next formed in one or more of the conductive layers 204 provided on the core in step 104. The conductance pattern in the top and bottom conductive layers 204 may be formed by various methods including for example by silk screening and by photolithography. An example of a conductance pattern is shown in the top layer in FIG. 6. It is understood that one or more of the remaining conductive layers may also have conductance patterns defined therein as well.

In accordance with the present disclosure, a shield ring 210 may be formed in the conductance pattern in the top conductive layer 204, near or at an outer periphery of the substrate 202. The shield ring 210 forms part of a shield for preventing the transmission and receipt of EMI and/or RFI radiation. In one example, the shield ring 210 may have a width of approximately 1 mm to 3 mm, though this width may vary above or below that in further embodiments.

Vias 205a are provided through the shield ring 210 on one or more sides to electrically ground the shield ring 210 to ground pads 218a formed in the bottom conductive layer 204 of substrate 202. In embodiments, the vias 205a may also be electrically coupled to the ground plane 204a. In further embodiments, ground plane 204a may be omitted.

Shield ring 210 may include a plurality of slots 212 and/or holes 214, only some of which are numbered in the figures. In the example shown, first and second sides of the shield ring 210 include only slots 212, a third side includes only holes 214, and a fourth side includes a combination of slots 212 and holes 214. However, it is understood that any combination of slots 212 and/or holes 214 may be used around the four sides of shield ring 210. Moreover, the number of slots and holes provided in each side is shown by way of example only, and may vary above or below that shown in further embodiments.

The slots 212 may be generally rectangular openings in the top conductive layer 204, and the holes 214 may be generally circular openings in the top conductive layer 204. However, the slots may be other shapes, such as square, and the holes may be other shapes, such as oval or elliptical, in further embodiments. In one example, each slot 212 may have a diameter of about 3 mm and length of 10 mm, and the holes may have a diameter of 3 mm, though these dimensions may each vary in further embodiments. The slots 212 in one or more sides may all be the same size, or they may be different sizes. The same is true for the holes 214. In one example, each slot 212 and/or hole 214 is separated from the next by as much as 3 mm. However, this spacing may vary above or below that in further embodiments. The slots and/or holes allow plating in the z-direction through the thickness of the substrate to provide shielding in that dimension.

The conductance pattern(s) in the layers 204 of substrate 202 may further include electrical traces 206 and contact pads 208 (some of which are numbered in the figures). The traces 206 and contact pads 208 shown are by way of example, and the substrate 202 may include more traces and/or contact pads than are shown in the figures, and they may be in different locations than are shown in the figures. Other structures may be provided in the conductance pattern such as for example test pins for testing the operation of the semiconductor device 200. The conductance pattern in the various conductive layers 204 of the substrate 202 may be formed by a variety of known processes, including for example various silk screening or photolithographic processes.

Figure 1:
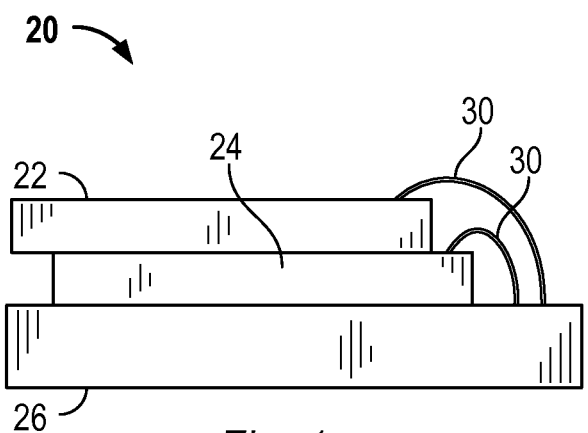
FIGS. 1 and 2 are prior art edge views of two conventional semiconductor package designs with the molding compound omitted.
Figure 2:
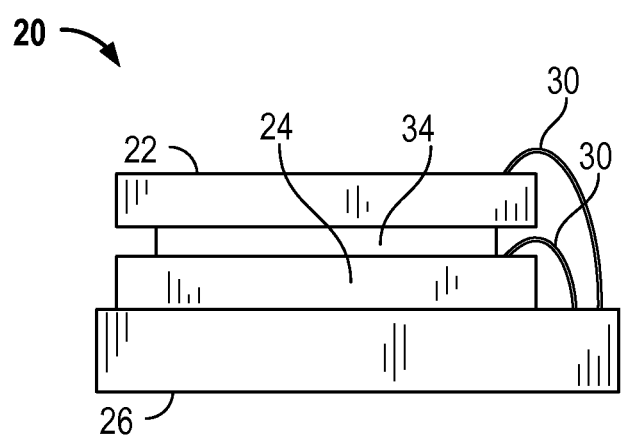

Referring again to FIG. 1, the substrate 202 may next be inspected in an automatic optical inspection (AOI) in step 108. Once inspected, a solder mask may be applied to the substrate 202 in step 110. The solder mask is a layer of polymer that provides a protective coating for the copper traces of the conductance pattern and prevents solder from bleeding beyond the exposed contact pads and test pins, thereby preventing short circuits. The application of the solder mask layer may be performed by methods including by silk screening and by photolithography. The solder mask is not applied to the shield ring 210.

After formation of the solder mask layer, the exposed portions of the conductance pattern on the top layer and bottom layer may be plated with a Ni/Au layer or the like in step 112 in a known electrolytic plating, electro-less or thin film deposition process. The shield ring 210 is also plated in step 112, including the slots 212 and holes 214.

In step 116, the substrate 202 may be inspected and tested in an automated inspection process, and in step 120, the substrate may undergo a final visual inspection, to check electrical operation, and for contamination, scratches and discoloration.

Assuming the substrate 202 passes inspection, one or more semiconductor die may next be affixed to the top surface of the substrate 202 in a step 124. The one or more semiconductor die may then be wire bonded to the substrate 202 in a step 126 and as shown in the edge and top views of FIGS. 7 and 8. In the illustrated example, the semiconductor device 200 includes a pair of memory die 224 and a controller die 225. The memory die 224 may for example be flash memory chips (NOR/NAND), though other types of memory die are contemplated. It is understood that a single memory die 224 may be provided and that more than two memory die may be provided. The controller die 225 may for example be an ASIC.

The wire bonds 226 may be connected between die bond pads 230 on the die 224, 225 and the contact pads 208 on the substrate 202. Only some of the die bond pads 230 and wire bonds 226 are shown and labeled. While the die bond pads 230 are shown along a single side of the die 224, 225 in the figures, it is understood that the die bond pads 230 and wire bonds 226 may be off multiple sides of the die 224, 225 to contact pads 208 adjacent multiple edges of the substrate 202.

Although not shown, one or more passive components may also be affixed and electrically coupled to the substrate 202. The one or more passive components may be mounted on the substrate 202 and electrically coupled to the conductance pattern as by connection to contact pads in known surface mount and reflow processes. The passive components may include for example one or more capacitors, resistors and/or inductors, though other components are contemplated.

In step 128, the semiconductor device 200 may undergo a plasma clean process to remove particulate and to improve the wettability of the surface to allow better flow properties of a molding compound used to protect the semiconductor die and wire bonds.

After the die 224 have been mounted and wire bonded to the substrate, the die 224, 225 and wire bonds 226 may be encapsulated in a molding compound 240 in a first encapsulation step (step 130). In embodiments, the molding compound 240 may be formed by transfer molding, using an epoxy known for example from Nitto Denko Corp. of Japan.

In a further embodiment, instead of transfer molding, the molding compound 240 encapsulation may be formed by FFT (Flow Free Thin) compression molding. Such an FFT compression molding process is known and described for example in a publication by Matsutani, H. of Towa Corporation, Kyoto, Japan, entitled "Compression Molding Solutions For Various High End Package And Cost Savings For Standard Package Applications," Microelectronics and Packaging Conference, 2009, which publication is incorporated by reference herein in its entirety. In general, an FFT compression machine makes use of a technique where the panel of substrates is immersed in a mold containing a molten resin.

Regardless of the type of encapsulation process, a portion or all of the shield ring 210 is left exposed in step 130. The molding compound 240 may cover all of the semiconductor die 224, 225 and all of the substrate 202 within the periphery of the shield ring 210. Alternatively, the molding compound 240 may be applied in different configurations so that portions of the substrate 202 within the periphery of the shield ring are left devoid of molding compound.

Referring now to step 134 and the edge and top views of FIGS. 11 and 12, the semiconductor device 200 may be plated with one or more layers of material 244 following the first encapsulation process. In embodiments, the bottom surface of the device 200 may be covered with a mask so as not to be plated during step 134 and to prevent contact pads 218 from shorting to one another. All other outer surfaces of the semiconductor device 200 may be evenly plated in step 134. For example, the shield ring 210 is plated, and the top and side edges of molding compound 240 are plated.

The material 244 used for plating may be copper alone, or may be nickel-flash on top of copper. Other conductive plating materials 244 may be used. For plating, nickel or copper may be plated first in an electro-less plating process as seed layer. The electro-less nickel or electro-less copper plating provides a seed layer, as is known in the PCB industry. The seed layer plating serves as an electrode to allow a subsequent electrolytic plating of copper or other metal, which is faster and can be plated up to about 18 μm thick. The plating of material 244 may be thicker or thinner than 18 μm in further embodiments.

The plating material 244 and shield ring 210 together provide an EMI/RFI shield 250 for the semiconductor device 200. In embodiments, the EMI/RFI shield may be the plating material 244 by itself. The plating material 244 and shield ring 210 may be electrically coupled to ground pads 218a by vias 205a. As explained below, ground pads 218 may be coupled to ground on a host PCB. As noted above, a ground plane 204a may also be provided and coupled to vias 205a and ground pads 218. Thus, the semiconductor device 200 may be completely encapsulated in the EMI/RFI shield 250. As noted, in embodiments, the ground plane 204a may be omitted. In such embodiments, the EMI/RFI shield may cover the sides and top of the semiconductor device 200.

Figure 13:
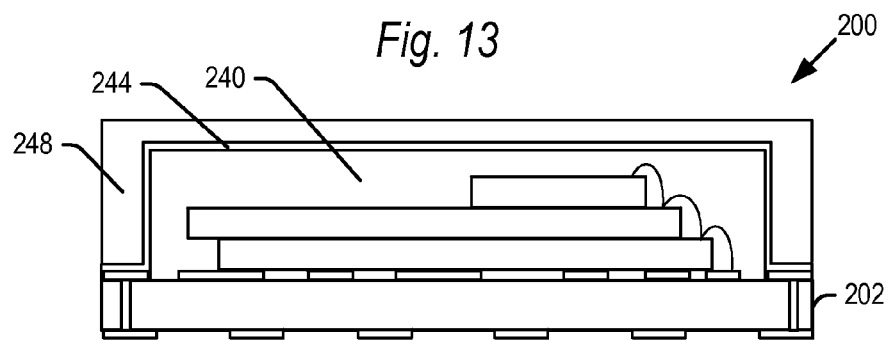
FIG. 13 is an edge view of a semiconductor device according to the present disclosure following a second encapsulation process.
Figure 14:
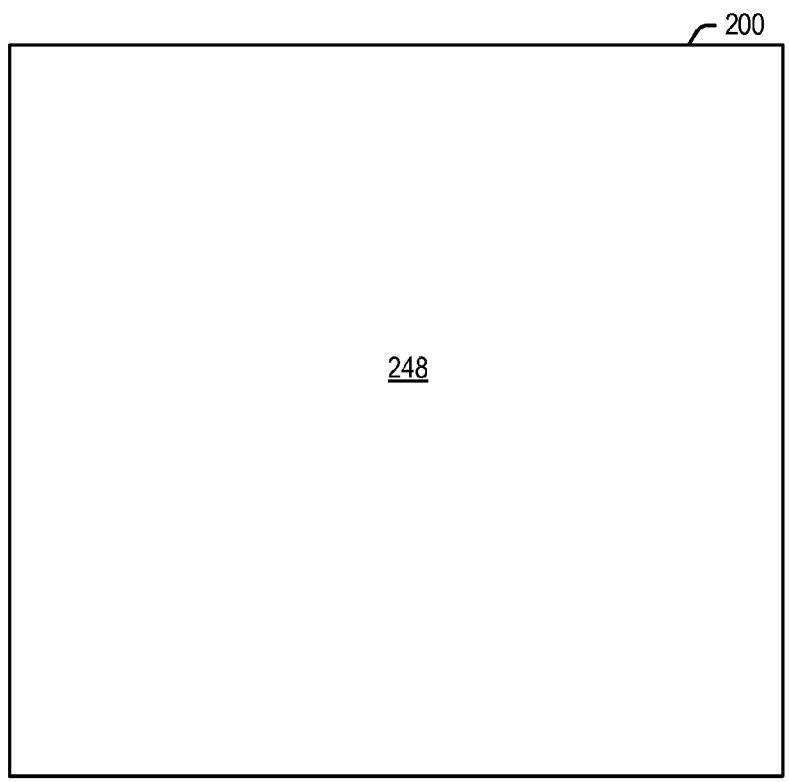
FIG. 14 is a top view of a semiconductor device according to the present disclosure following a second encapsulation process.

Referring now to step 136 and the edge and top views of FIGS. 13 and 14, following the plating step, a second encapsulation process may be performed in step 136. This step may apply a molding compound 248 to completely encase the plating material 244 on the semiconductor device 200. The molding compound 248 may be any of the same materials as molding compound 240, and may be applied in any of the same processes used to apply molding compound 240. Molding compound 248 need not be the same as molding compound 240 in further embodiments, including for example FFT compression molding. While there are advantages to the second encapsulation process in step 136, it is understood that the second encapsulation process may be omitted in further embodiments, leaving the shield 250 as the outer surface of the device 200.

Figure 15:
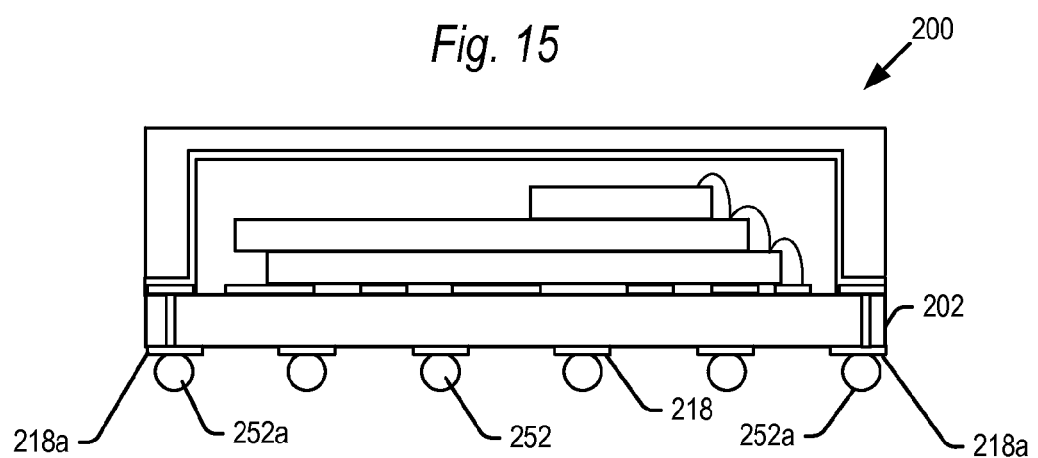
FIG. 15 is an edge view of a semiconductor device according to the present disclosure including a solder ball for attaching to a host device printed circuit board.

In step 140, solder balls 252 may be applied to contact pads 218 on the bottom surface of the semiconductor device 200, as shown in the edge view of FIG. 15. The solder balls allow the device 200 to be surface mounted to a PCB (not shown) in a host device. The contact pads 218 include ground pads 218a as noted above, which may each receive a solder ball 252a. The EMI/RFI shield 250 may be coupled to a ground position on the PCB by vias 205a, ground pads 218a and solder balls 252a.

In further embodiments, the solder balls 252 including solder balls 252a may be omitted. For example, the semiconductor device 200 may be a land grid array (LGA) package which may be removably inserted into operative position in a host device. In such packages, the contact pads 218 on the bottom surface of the device 200 may be contact fingers. One or more of these contact fingers may be a ground finger designed to mate with a grounded connection in the host device. The EMI/RFI shield may be electrically coupled to such a ground finger in this embodiment.

After the solder balls are applied, or after the second encapsulation step where solder balls are omitted, the semiconductor devices 200 may be singulated from the panel 201 in step 144 to form the finished semiconductor device 200. Each device 200 may be singulated by any of a variety of cutting methods including sawing, water jet cutting, laser cutting, water guided laser cutting, dry media cutting, and diamond coating wire cutting. While straight line cuts will define a generally rectangular or square shaped device 200, it is understood that device 200 may have shapes other than rectangular and square in further embodiments of the present invention.

Once cut into devices 200, the devices may be tested in a step 148 to determine whether the packages are functioning properly. As is known in the art, such testing may include electrical testing, burn in and other tests. The devices may optionally be encased within a lid in step 150.

In summary, in one embodiment, the present technology relates to a semiconductor package, comprising: a substrate; one or more semiconductor die affixed to the substrate; and a plated EMI/RFI shield affixed to the substrate around the one or more semiconductor die.

In another embodiment, the present technology relates to a semiconductor device, comprising: a substrate; one or more semiconductor die affixed to the substrate; a first molding compound formed on the substrate around the one or more semiconductor die; and an EMI/RFI shield applied to the first molding compound around first molding compound and the one or more semiconductor die.

In a further embodiment, the present technology relates to a method of shielding a semiconductor device from electromagnetic radiation, comprising the steps of: (a) mounting one or more semiconductor die on a substrate; (b) encapsulating the one or more semiconductor die on the substrate in molding compound; and (c) plating a metal around the molding compound, said plating step including the step of electrically coupling the plated metal to a ground pad on the substrate.

In another embodiment, the present technology relates to a method of shielding a semiconductor device from electromagnetic radiation, comprising the steps of: (a) forming conductance pattern on a substrate, the conductance pattern including a shield ring, electrical traces and contact pads; (b) a mounting one or more semiconductor die on the substrate, interiorly of the shield ring; (c) encapsulating the one or more semiconductor die on the substrate in a first molding compound; and (d) plating a metal around the first molding compound and the onto the shield ring.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a substrate including a conductance pattern including contact pads and electrical traces;
   one or more semiconductor die affixed to the substrate; and
   a plated EMI/RFI shield formed in the conductance pattern of the substrate around the one or more semiconductor die.

2. The semiconductor device of claim 1, wherein the plated EMI/RFI shield includes a shield ring plated on the substrate.

3. The semiconductor device of claim 2, wherein the shield ring is formed around an outer periphery of the substrate.

4. The semiconductor device of claim 2, wherein the shield ring includes a plurality of slots.

5. The semiconductor device of claim 2, wherein the shield ring includes a plurality of holes.

6. The semiconductor device of claim 2, wherein the plated EMI/RFI shield further includes plating material coupled to the shield ring and extending around the one or more semiconductor die on one side of the substrate.

7. The semiconductor device of claim 1, further comprising a first encapsulation layer around the one or more semiconductor die and within the EMI/RFI shield.

8. The semiconductor device of claim 1, further comprising a second encapsulation layer around the EMI/RFI shield.

9. A semiconductor device, comprising:
   a substrate including a conductance pattern having contact pads and electrical traces;
   one or more semiconductor die affixed to the substrate;
   a shield ring, including one or slots and holes, in the conductance pattern in a continuous ring around the one or more semiconductor die;
   a first molding compound formed on the substrate around the one or more semiconductor die; and
   an EMI/RFI shield applied to the first molding compound around first molding compound and the one or more semiconductor die.

10. The semiconductor device of claim 9, further comprising a second molding compound around the EMI/RFI shield.

11. The semiconductor device of claim 9, wherein the EMI/RFI shield is a plated metal applied to the substrate and around the first molding compound.

12. The semiconductor device of claim 9, wherein the first molding compound is applied to the substrate to cover the one or more semiconductor die, but does not completely cover the shield ring.

* * * * *